United States Patent
Keite-Telgenbüscher et al.

(10) Patent No.: US 10,323,163 B2
(45) Date of Patent: Jun. 18, 2019

(54) ADHESIVE TAPE CONTAINING GETTER MATERIAL

(71) Applicant: TESA SE, Hamburg (DE)

(72) Inventors: Klaus Keite-Telgenbüscher, Hamburg (DE); Jan Ellinger, Hamburg (DE); Judith Grünauer, Hamburg (DE); Anika Petersen, Bimöhlen (DE)

(73) Assignee: TESA SE, Norderstedt (DE)

( * ) Notice: Subject to any disclaimer, the term of this patent is extended or adjusted under 35 U.S.C. 154(b) by 0 days.

(21) Appl. No.: 14/653,143

(22) PCT Filed: Dec. 5, 2013

(86) PCT No.: PCT/EP2013/075639
§ 371 (c)(1),
(2) Date: Jun. 17, 2015

(87) PCT Pub. No.: WO2014/095387
PCT Pub. Date: Jun. 26, 2014

(65) Prior Publication Data
US 2015/0337174 A1    Nov. 26, 2015

(30) Foreign Application Priority Data
Dec. 21, 2012 (DE) .................. 10 2012 224 310

(51) Int. Cl.
*H01L 23/26* (2006.01)
*C09J 7/22* (2018.01)
(Continued)

(52) U.S. Cl.
CPC ............... *C09J 7/22* (2018.01); *B32B 27/14* (2013.01); *B32B 27/32* (2013.01); *C09J 7/29* (2018.01);
(Continued)

(58) Field of Classification Search
None
See application file for complete search history.

(56) References Cited

U.S. PATENT DOCUMENTS

| 4,051,195 A | 9/1977 | McWhorter |
| 4,150,170 A | 4/1979 | Lazear et al. |

(Continued)

FOREIGN PATENT DOCUMENTS

| CN | 101155890 A | 4/2008 |
| DE | 19646048 A1 | 5/1998 |

(Continued)

OTHER PUBLICATIONS

International Search Report for PCT/EP2013/075639 dated Mar. 3, 2014.

(Continued)

*Primary Examiner* — Frank D Ducheneaux
(74) *Attorney, Agent, or Firm* — Norris McLaughlin PA

(57) ABSTRACT

The aim of the invention is to effectively protect a flat adhesive compound from permeates originating from the surroundings as well as from permeates trapped during lamination, winding, stacking or other processing steps. For this purpose, the adhesive tape comprises at least the following layers in the indicated order: a first outer adhesive compound layer A, a layer B, which contains at least one inorganic getter material, and a second outer adhesive compound layer C. The invention also relates to the use of said adhesive tape as an encapsulation material.

10 Claims, 3 Drawing Sheets

(51) Int. Cl.

| | | |
|---|---|---|
| *C09J 7/29* | (2018.01) | |
| *C09J 153/02* | (2006.01) | |
| *C09J 171/00* | (2006.01) | |
| *C09J 177/02* | (2006.01) | |
| *C09J 177/06* | (2006.01) | |
| *C09J 7/38* | (2018.01) | |
| *C09J 7/40* | (2018.01) | |
| *C08K 3/08* | (2006.01) | |
| *C08K 3/22* | (2006.01) | |
| *C08K 3/34* | (2006.01) | |
| *B32B 27/14* | (2006.01) | |
| *B32B 27/32* | (2006.01) | |
| *C09J 153/00* | (2006.01) | |
| *H01L 51/52* | (2006.01) | |
| *H01L 23/31* | (2006.01) | |

(52) U.S. Cl.
CPC . *C09J 7/38* (2018.01); *C09J 7/40* (2018.01); *H01L 23/26* (2013.01); *B32B 2264/10* (2013.01); *B32B 2405/00* (2013.01); *C08K 3/08* (2013.01); *C08K 3/22* (2013.01); *C08K 3/34* (2013.01); *C09J 153/005* (2013.01); *C09J 153/025* (2013.01); *C09J 171/00* (2013.01); *C09J 177/02* (2013.01); *C09J 177/06* (2013.01); *C09J 2201/128* (2013.01); *C09J 2201/20* (2013.01); *C09J 2201/606* (2013.01); *C09J 2201/61* (2013.01); *C09J 2203/326* (2013.01); *C09J 2205/106* (2013.01); *C09J 2400/123* (2013.01); *C09J 2400/243* (2013.01); *C09J 2400/263* (2013.01); *C09J 2423/006* (2013.01); *C09J 2423/046* (2013.01); *C09J 2433/00* (2013.01); *C09J 2453/00* (2013.01); *C09J 2463/00* (2013.01); *C09J 2471/00* (2013.01); *H01L 23/3164* (2013.01); *H01L 51/524* (2013.01); *H01L 2924/0002* (2013.01); *Y10T 428/24331* (2015.01); *Y10T 428/249983* (2015.04); *Y10T 428/2848* (2015.01)

(56) References Cited

U.S. PATENT DOCUMENTS

| | | | |
|---|---|---|---|
| 4,181,752 A | 1/1980 | Martens et al. | |
| 4,330,590 A | 5/1982 | Vesley | |
| 4,379,201 A | 4/1983 | Heilmann et al. | |
| 4,391,687 A | 7/1983 | Vesly | |
| 4,552,604 A | 11/1985 | Green | |
| 5,939,190 A | 8/1999 | Pfaff et al. | |
| 6,833,668 B1 | 12/2004 | Yamada et al. | |
| 6,936,131 B2 * | 8/2005 | McCormick | H01L 51/5237 156/292 |
| 6,958,186 B2 * | 10/2005 | Husemann | C09J 7/0242 428/346 |
| 8,628,859 B2 * | 1/2014 | Weigel | B32B 17/10018 427/412.2 |
| 2003/0057574 A1 | 3/2003 | Boroson et al. | |
| 2004/0104673 A1 | 6/2004 | Hosokawa et al. | |
| 2004/0169174 A1 | 9/2004 | Huh et al. | |
| 2004/0216778 A1 | 11/2004 | Ferri et al. | |
| 2006/0100299 A1 | 5/2006 | Malik et al. | |
| 2009/0022967 A1 | 1/2009 | Inenaga | |
| 2010/0000653 A1 | 1/2010 | Krawinkel et al. | |
| 2010/0068514 A1 | 3/2010 | Ellinger et al. | |
| 2010/0137524 A1 | 6/2010 | Grittner et al. | |
| 2010/0148127 A1 | 6/2010 | Ellinger et al. | |
| 2011/0121356 A1 | 5/2011 | Krawinkel et al. | |
| 2014/0170326 A1 | 6/2014 | Grittner et al. | |

FOREIGN PATENT DOCUMENTS

| | | |
|---|---|---|
| DE | 19913761 A1 | 9/2000 |
| DE | 102006047739 A1 | 4/2008 |
| DE | 102008047964 A1 | 3/2010 |
| DE | 102008052625 A1 | 4/2010 |
| DE | 102008059050 A1 | 5/2010 |
| DE | 102008062130 A1 | 6/2010 |
| DE | 102008060113 A1 | 7/2010 |
| EP | 0232060 A2 | 8/1987 |
| EP | 0573570 B1 | 10/1996 |
| EP | 0835915 B1 | 4/1998 |
| EP | 1383182 A2 | 1/2004 |
| EP | 1407818 A1 | 4/2004 |
| JP | H4296381 A | 10/1992 |
| JP | H07169567 A | 7/1995 |
| JP | 2005298703 A | 10/2005 |
| WO | 9801910 A1 | 1/1998 |
| WO | 9821287 A1 | 5/1998 |
| WO | 03002684 A1 | 1/2003 |
| WO | 03065470 A1 | 8/2003 |
| WO | 03088371 A2 | 10/2003 |
| WO | 2005037916 A1 | 4/2005 |
| WO | 2007087281 A1 | 8/2007 |
| WO | 2008036707 A2 | 3/2008 |
| WO | 2008122489 A1 | 10/2008 |
| WO | 2009086095 A2 | 7/2009 |

OTHER PUBLICATIONS

Written Opinion of the International Searching Authority for for PCT/EP2013/075639 dated Mar. 3, 2014.

German Search Report for DE Application 10 2012 224 310.0 dated Nov. 21, 2013.

English translation of Chinese Office Action in corresponding application CN 201380072624.8 dated Aug. 22, 2017.

* cited by examiner

ADHESIVE TAPE CONTAINING GETTER MATERIAL

This application is a § 371 U.S. national stage of PCT International Patent Application No. PCT/EP2013/075631, filed Dec. 5, 2013, which claims foreign priority benefit under 35 U.S.C. § 119 of (1) German Patent Application No. DE 10 2012 224 319.4, filed Dec. 21, 2012 and (2) German Patent Application No. DE 10 2013 202 473.8, filed Feb. 15, 2013, the disclosures of which patent applications are incorporated herein by reference.

The present invention relates to the technical field of the encapsulation materials for the protection of electronic arrangements. An adhesive tape suitable for this purpose is proposed which features an enhanced protective function with respect more particularly to permeable substances.

Optoelectronic arrangements are being used with ever-increasing frequency in commercial products or are close to market introduction. Such arrangements comprise organic or inorganic electronic structures, examples being organic, organometallic or polymeric semiconductors or else combinations of these. Depending on the desired application, the products in question are rigid or flexible in form, there being an increasing demand for flexible arrangements. Arrangements of this kind are frequently produced by printing techniques such as relief, gravure, screen or planographic printing or else by what is known as non-impact printing such as, for instance, thermal transfer printing, inkjet printing or digital printing. In many cases, however, vacuum techniques are used as well, such as chemical vapor deposition (CVD), physical vapor deposition (PVD), plasma-enhanced chemical or physical deposition techniques (PECVD), sputtering, (plasma) etching or vapor coating. Patterning generally takes place through masks.

Examples of optoelectronic applications that are already available commercially or are of interest in terms of their market potential include electrophoretic or electrochromic constructions or displays, organic or polymeric light-emitting diodes (OLEDs or PLEDs) in readout and display devices or as illumination, and also electroluminescent lamps, light-emitting electrochemical cells (LEECs), organic solar cells such as dye or polymer solar cells, inorganic solar cells, more particularly thin-film solar cells, based for example on silicon, germanium, copper, indium and selenium, organic field-effect transistors, organic switching elements, organic optical amplifiers, organic laser diodes, organic or inorganic sensors or else organic- or inorganic-based RFID transponders.

A perceived technical challenge for the realization of sufficient lifetime and function of optoelectronic arrangements in the area of organic and inorganic optoelectronics, especially of organic optoelectronics, is the protection of the components they contain against permeates. Permeates are generally considered to be gaseous or liquid substances which penetrate a solid body and may pervade it or migrate through it. Accordingly, numerous organic or inorganic compounds of low molecular mass may be permeates, with water vapor and oxygen being of particular significance in the context presently described.

A multiplicity of optoelectronic arrangements—especially where organic materials are used—are sensitive both to water vapor and to oxygen. During the lifetime of the electronic arrangements, therefore, protection is necessary through encapsulation, since otherwise there is a dropoff in performance over the application period. In the case of inadequate protection, for example, oxidation or hydrolysis processes may drastically reduce the luminosity in the case of electroluminescent lamps (EL lamps) or organic light-emitting diodes (OLEDs), the contrast in the case of electrophoretic displays (EP displays) or the efficiency in the case of solar cells, within a short time.

Within the field of inorganic and more particularly organic optoelectronics, therefore, there is a high demand for flexible adhesive bonding solutions which represent a barrier to permeates such as oxygen and/or water vapor. A number of approaches to such adhesive bonding solutions can already be found in the prior art.

Accordingly, with relative frequency, liquid adhesives based on epoxides are used as barrier adhesives, as are described in WO 98/21287 A1, U.S. Pat. Nos. 4,051,195 and 4,552,604, for example. Their principal field of use is in edge bonds in rigid arrangements, but also moderately flexible arrangements. Curing takes place thermally or by means of UV radiation.

The use of these liquid adhesives is accompanied, however, by a series of unwanted effects as well. For instance, low molecular mass constituents (VOCs—volatile organic compounds) may damage the sensitive electronic structures of the arrangement and complicate production. The adhesive, furthermore, has to be applied, in a costly and inconvenient procedure, to each individual constituent of the arrangement. The acquisition of expensive dispensers and fixing devices is necessary in order to ensure precise positioning. The nature of the application has the effect, moreover, of preventing a rapid, continuous operation. In the laminating step that is subsequently necessary, the low viscosity may hinder the attainment of a defined film thickness and bond width.

An alternative is to use pressure-sensitive adhesives or hotmelt adhesives to seal optoelectronic constructions. Among the pressure-sensitive adhesives (PSAs) preference is given to using those which after bonding are crosslinkable by introduction of energy (for example, actinic radiation or heat). Adhesives of these kinds are described in US 2006/0100299 A1 and WO 2007/087281 A1 for example. Their advantage lies in particular in the fact that the barrier effect of the adhesives can be enhanced by crosslinking.

Also known in the prior art is the use of hotmelt (HM) adhesives. Used here in many cases are copolymers of ethylene, as for example ethylene-ethyl acetate (EEA), ethylene-acrylic acid copolymer (EAA), ethylene-butyl acrylate (EBA) or ethylene-methyl acrylate (EMA). Crosslinking ethylene-vinyl acetate (EVA) copolymers are in general used more particularly for solar cell modules based on silicon wafers. Crosslinking takes place during the sealing operation under pressure and at temperatures of above around 120° C. For many optoelectronic constructions based on organic semiconductors or produced in thin-film processes, this operation is deleterious, as a result of the high temperatures and the mechanical load imposed by the pressure.

Hotmelt adhesives based on block copolymers or functionalized polymers are described in WO 2008/036707 A2, WO 2003/002684 A1, JP 2005-298703 A, and US 2004/0216778 A1, for example. An advantage of these adhesives is that the adhesives themselves do not introduce any substance—or only very little substance—into the construction to be encapsulated that itself harms the construction, whereas this problem is relevant particularly in the case of reactive liquid adhesive systems, more particularly those based on acrylate or on epoxy resin. In view of the high number of reactive groups, these systems have a relatively high polarity, and so, in particular, water is present therein. The amount is generally in the range of less than 100 ppm up to more than 1%. For this reason among others, such liquid adhesives are used primarily as an edge sealant for the electronic arrangements, where they are not in direct contact with the active electronic materials.

Another possibility for countering the problem of entrained permeates is to include additionally an absorbing material—called a getter—within the encapsulation, this getter binding—by absorption or adsorption, for example—water or other permeates that permeate through the adhesive or diffuse out of it. An approach of this kind is described in EP1407818 A1, US 2003/0057574 A1 and in US 2004/0169174 A1, among others. The equipping of an adhesive with permeate-binding substances and/or properties is described for example, moreover, in JP 07-169567, WO 98/01910 A1, WO 03/088371 A2, US 2004-0104673 A1, WO 03/065470 A1, JP 04-296381, U.S. Pat. No. 6,833,668, DE 102008062130 A1, DE 102008060113 A1 and DE 102008047964 A1.

DE 196 46 048 A1 describes a packaging laminate for transdermal therapeutic systems that comprises a drying agent present in dispersion in a sheetlike layer, this layer being affixed to the packaging laminate through agency of an adhesive-coated film. The packaging laminate dries the gas space in the packaging.

DE 199 13 761 A1 describes a sheetlike drying device for drying a surrounding gas space, which comprises a matrix with a drying agent present therein, a pressure sensitive adhesive being one possibility for the matrix.

A fundamental disadvantage of an adhesive with getter material distributed therein is the adverse effect of the getter material on the adhesive properties. Thus this material may take up space on the contact surface with the substrate to be bonded, such space then no longer being available for adhesive bonding. Furthermore, in the encapsulation of electronic arrangements, the getter material may get into direct contact with the arrangement and damage it on account of the material's reactivity.

WO 2009/086095 A2 describes an encapsulation system comprising a flexible barrier film, an adhesive applied at least partly to the barrier film, and a drying agent which is applied at least over part of the barrier film or of the adhesive. A disadvantage is the complex production of a layer with this kind of structuring.

It is possible, furthermore, to use raw materials with a particularly low permeate content or to free the adhesive from permeating substances during production or prior to application, by means, for example, of thermal drying, vacuum drying, freeze drying or the admixing of getters. Disadvantages of such methods are the long drying time and the possibly high or low drying temperatures, which may harm the adhesive or initiate chemical reactions, such as crosslinking, for example. Moreover, the operation of admixing and subsequently removing the getters is costly and inconvenient.

Where such adhesive-related measures are taken to reduce the introduction of harmful permeating substances into the construction that is to be protected, it is necessary to maintain the properties produced with the minimum possible restriction, until the adhesive is used. Thus, for example, an adhesive which has been produced in a particularly anhydrous procedure must be protected from water uptake from the environment.

This problem is generally solved by providing the adhesives with packaging which is impervious to permeation or at least which inhibits permeation. Liquid adhesives are generally dispensed into corresponding containers, made of metal, for example. Adhesive tapes are often welded into flexible pouches made from permeation-inhibiting material—for example, from polyethylene film or from a film laminate of aluminum and polyester. The packaging materials themselves must also be very largely free from permeates that might be released on the contents side.

In order to counter weaknesses in the imperviosity of the packaging or to ensure rapid binding of permeates included, a getter is often included in the packaging as well, in the form for example of a pouch filled with silica gel or zeolite. This getter is generally not in direct contact with the contents. A particular disadvantage with this method is the increased cost and inconvenience of packaging.

A specific problem arises in the packaging of sheetlike adhesives, i.e., adhesive tapes or adhesive sheets: when they are stacked as shapes or wound to form a roll, gas—air, for example—is included, which is not in exchange with the rest of the gas space remaining in the packaging. Unwanted permeates present, for example water vapor, therefore do not reach the getter material located in the packaging, and may therefore migrate into the adhesive. Furthermore, such adhesive tapes generally include a temporary liner material, and also often a carrier material as well. These materials may likewise comprise unwanted permeates, which may easily permeate into the adhesive in view in particular of the large area of contact with said adhesive. Getter pouches or getter pads introduced into the packaging may not reliably scavenge and bind these permeates. Freeing the liner materials and carrier materials entirely from the unwanted permeates, by means of drying, for example, is laborious, costly and inconvenient.

There is therefore an ongoing need for suitable measures to protect sheetlike adhesives from permeates.

It is an object of the present invention, therefore, to provide a sheetlike adhesive effectively protected not only from permeates originating from the environment but also from permeates included in the course of laminating, winding or stacking or other processing steps. Accordingly, in the case of a product, such as an adhesive tape, which comprises a largely permeate-free adhesive layer, this adhesive layer is to be further kept largely free from permeates at least for the period of storage and of transport.

The achievement of this object derives from the fundamental concept of the present invention, namely the incorporation of at least one getter material in a suitable way into a sheetlike adhesive.

A first subject of the invention, therefore, is an adhesive tape which comprises at least the following layers in the order stated:
  a first outer layer, A, of adhesive,
  a layer B which comprises at least one inorganic getter material, and
  a second outer layer, C, of adhesive.

An adhesive tape of this kind can be used to produce outstanding protection for the adhesives against permeates without any substantial adverse effect on the technical adhesive properties.

The subject of the invention relates in particular to an adhesive tape which comprises at least the following layers in an order orthogonal to the principal plane:
  a first outer layer, A, of adhesive,
  a layer B which comprises at least one inorganic getter material, and
  a second outer layer, C, of adhesive.

An "adhesive tape" is a carrier material coated with at least one PSA or with at least one reactivatable adhesive, or a PSA or reactivatable adhesive of durable design that is present in the form of a sheetlike structure. An adhesive tape is regarded in accordance with the invention as being a sheetlike structure, in other words a structure extended essentially in two dimensions. Tapes with extended length and limited width, tape sections, labels, diecuts, and the like are therefore encompassed by the term "adhesive tape". Not encompassed, on the other hand, are cured and as yet uncured liquid adhesives, and bonds produced therewith.

The "principal plane" in accordance with the invention is the adhesive tape surface having the greatest extent. In the adhesive tape of the invention, of course, this principal plane is present twice, in an orientation parallel each to the other and at a distance from the extent in the remaining dimension. In accordance with the invention it is an arbitrary matter which of these two surfaces is considered the "principal plane".

"Outer" layers of adhesive, in accordance with the invention, means that the layers A and C on one side each of the adhesive tape of the invention form the outermost layer which finishes off the layer construction. Any release liner lying on the layers of adhesive is not regarded as part of the adhesive tape of the invention.

The layers A and C of adhesive preferably consist in each case independently of one another of a PSA or of an activatable adhesive or, more particularly, of an activatable PSA. With particular preference, both layers of adhesive, A and C, consist of a PSA or of an activatable adhesive or, more particularly, of an activatable PSA; in this particularly preferred variant, then, both layers of adhesive each consist of an adhesive of the same type. In a preferred embodiment of the invention, at least one of the layers of adhesive A and C consists of a PSA. With particular preference each of the layers A and C of adhesive consists of a PSA. With very particular preference the layers A and C of adhesive consist of the same PSA.

"Pressure sensitive adhesives" (or "PSAs"), generally and in accordance with the invention, denote adhesives whose set film at room temperature in the dry state remains permanently tacky and adhesive. PSAs permit a durable bond to the substrate even under relatively weak applied pressure, and after use can be detached from the substrate again substantially without residue. The bondability of the adhesives derives from their adhesive properties, and the redetachability from their cohesive properties.

In accordance with the invention it is possible to use all PSAs known to the skilled person in the layers A and C of adhesive—in other words, for example, PSAs based on acrylates and/or methacrylates, polyurethanes, natural rubbers, synthetic rubbers; styrene block copolymer compositions with an elastomer block of unsaturated or hydrogenated polydiene blocks such as, for example, polybutadiene, polyisoprene, copolymers of both, polybutylene, more particularly polyisobutylene, and also other elastomer blocks familiar to the skilled person; polyolefins, more particularly poly-α-olefins and/or polyisobutylenes; fluoropolymers and/or silicones. The term "pressure sensitive adhesive" also encompasses further compositions possessing pressure-sensitively adhesive properties in accordance with the "Handbook of Pressure Sensitive Adhesive Technology" by Donatas Satas (Satas & Associates, Warwick 1999).

Where acrylate-based PSAs are mentioned in the context of this specification, they should be taken, even where not explicitly stated, to encompass PSAs based on methacrylates and based on acrylates and methacrylates, unless the description is expressly otherwise. In the sense of the invention it is likewise possible to employ combinations and mixtures of two or more base polymers, and also adhesives additized with tackifier resins, fillers, aging inhibitors and/or crosslinkers, the enumeration of the additives being intended to be merely exemplary and not limiting.

The polymer basis of the PSAs is preferably selected from styrene block copolymers, polybutylenes, especially polyisobutylenes, polyolefins, and fluoropolymers, and also mixtures of two or more of these polymers. The polymers listed are notable for representing a high permeation barrier to water vapor, and for a low water content. More particularly the polymer basis of the PSAs is selected from styrene block copolymers and polyisobutylenes and also mixtures of these polymers.

In principle the PSA layers A and C may be identical or different both in terms of their polymer basis and in terms of their composition otherwise.

In a further preferred embodiment of the invention, at least one of the layers A and C of adhesive consists of an activatable adhesive. With particular preference each of the layers A and C of adhesive consists of an activatable adhesive. With very particular preference the layers A and C of adhesive consist of the same activatable adhesive.

An "activatable adhesive" is an adhesive which in the unactivated state is unable to develop adhesion to a substrate in the sense of an adhesive bond. This becomes possible only through input of energy or through a physical interaction. All customary adhesive systems exhibiting activated bonding may in principle be employed as activatable adhesive. In accordance with the invention, activation is accomplished preferably and generally via an input of energy, as for example, and with particular preference, through actinic radiation or heat (heat-activatedly bonding adhesives).

Heat-activatedly bonding adhesives can be classed in principle in two categories: thermoplastic heat-activatedly bonding adhesives (hotmelt adhesives) and reactive heat-activatedly bonding adhesives (reactive adhesives). Likewise encompassed are those adhesives which can be assigned to both categories, namely reactive thermoplastic heat-activatedly bonding adhesives (reactive hotmelt adhesives).

Thermoplastic adhesives are based on polymers which on heating undergo reversible softening and solidify again during cooling. Thermoplastic adhesives which have emerged as being advantageous are especially those based on polyolefins and copolymers of polyolefins and also on their acid-modified derivatives, on ionomers, on thermoplastic polyurethanes, on polyamides, and also polyesters and copolymers thereof, and also on block copolymers such as styrene block copolymers.

In contrast, reactive heat-activatedly bonding adhesives comprise reactive components. The latter constituents are also identified as "reactive resins", in which heating initiates a crosslinking process which after the end of the crosslinking reaction ensures a durable, stable bond. Such adhesives preferably also comprise elastic components, for example synthetic nitrile rubbers or styrene block copolymers. Such elastic components give the heat-activatedly bonding adhesive particularly high dimensional stability even under pressure, on account of their high flow viscosity.

Radiation-activated adhesives are likewise based on reactive components. The latter constituents may comprise, for example, polymers or reactive resins in which the irradiation initiates a crosslinking process which after the end of the crosslinking reaction ensures a durable, stable bond. Such adhesives preferably also comprise elastic components, such as those recited above.

With particular preference at least one of the layers A and C of adhesive consists of an activatable PSA. With very particular preference each of the layers A and C of adhesive consists of an activatable PSA. More particularly, the layers A and C of adhesive consist of the same activatable PSA. Activatable PSAs exhibit instantaneous adhesion at room temperature and, moreover, are improved by the activation in their bond strength or other properties.

With preference at least one of the layers A and C of adhesive consists of an activatable adhesive or of a PSA having reactive components (reactive resins) based on epoxides, oxetanes, (meth)acrylates and/or styrene block copolymers that have been modified—for example, sulfonated, epoxidized and/or grafted with maleic anhydride.

At the time of the manufacture of the adhesive tape of the invention and/or prior to its use, in other words before the intended takeup of permeate from the adhesives by the getter material begins, the layers A and C of adhesive preferably have a permeate content of less than 2000 ppm, more preferably of less than 800 ppm. The ppm figure here relates to the relation between the total weight of permeates present and the analyzed weight of adhesive. The permeate content may be determined by means of gas chromatography in accordance with VDA 277 or, in the case of water, in accordance with DIN EN ISO 62 (gravimetric method, method 4) or DIN 53715 (Karl-Fischer titration) after storage of the test specimen for 24 hours at 23° C. and 50% relative atmospheric humidity. In the case of such low permeate contents in the adhesives, the capacity of the getter materials in layer B is not so greatly taxed by permeates present in the adhesives from the outset; instead, layer B is able better to fulfill its function as a scavenger of permeates hailing from the environment.

The layers A and C of adhesive preferably have a low permeation rate for the permeate to be immobilized. In the case of water vapor as the permeate, the water vapor permeation rate (WVTR) is preferably in each case less than 50 g/(m$^2$*d), more preferably less than 25 g/(m$^2$*d), based on an adhesive thickness of 50 μm. The WVTR here is measured at 38° C. and 90% relative atmospheric humidity in accordance with ASTM F-1249; the oxygen permeation rate (OTR) is measured at 23° C. and 50% relative atmospheric humidity in accordance with DIN 53380-Part 3.

As a result of the low permeation rate on the part of the adhesive, less permeate diffuses from the environment through the adhesive and into the getter material-containing layer, which is able therefore to fulfill its function for longer or can be furnished with a smaller amount of getter material, thus reducing the materials usage and saving on costs. This relates in particular to the time of the manufacture of an adhesive tape of the invention during which it is not yet protected by packaging or lining (e.g. by liner) from permeates diffusing in from the environment.

To optimize the properties it is possible for the adhesives of layers A and C independently of one another to be blended with one or more additives such as tackifiers (resins), plasticizers, fillers, pigments, UV absorbers, light stabilizers, aging inhibitors, crosslinking agents, crosslinking promoters or elastomers.

The amount or the coatweight of the layers A and C of adhesive independently of one another is preferably 1 to 2000 g/m$^2$, more preferably 10 to 100 g/m$^2$, with this "amount" or "coatweight" referring to the amount or coatweight after any solvent and/or water removal procedure that is carried out.

The adhesive tape of the invention comprises, between the outer layers A and C of adhesive, a layer B which comprises at least one inorganic getter material. In the context of this invention, the term "inorganic getter materials" also embraces silanes having at least one hydrolyzable substituent, and organometallic complexes/organometallic complexing agents. A "getter material" here is a substance capable of taking up (sorbing) one or more permeable substances. This sorbing of the permeable substance or substances by the getter material may take place, for example, by absorption or adsorption, with adsorption being able to occur either in the form of chemisorption or of physisorption. The getter material could therefore also be termed a "sorbent" or "sorption agent". The getter material is preferably capable at least of sorbing water.

A "permeable substance" is a substance which as a gaseous or liquid substance, or possibly even as a solid substance, is able to penetrate into one of the adhesives in the adhesive tape of the invention and subsequently to saturate it. Substances of this kind have been referred to above and are referred to below as "permeates" as well. The permeates may originate from the adhesive itself or from the environment, as for example from a carrier material present in the adhesive tape of the invention. From the adhesive itself come, frequently, low molecular mass organic compounds such as solvent residues, residual monomers, oils, resin components, plasticizers and water. The environment is often a source of water, volatile organic compounds (VOCs), low molecular mass hydrocarbons and oxygen. Substances considered to be "permeable substances" or "permeates" include more particularly the following: acetonitrile, 1-butanol, chlorobenzene, chloroform (trichloromethane), cyclohexane, diethyl ether, 1,4-dioxane, glacial acetic acid (acetic acid), acetic anhydride, acetic acid ethyl ester (ethyl acetate, ethyl ethanoate), acetic acid n-butyl ester (n-butyl acetate), acetic acid tert-butyl ester (tert-butyl acetate), ethanol, methanol, n-hexane, n-heptane, 3-hexanone, 2-propanol (isopropanol), 3-methyl-1-butanol (isoamyl alcohol), methylene chloride (dichloromethane), methyl ethyl ketone (butanone), methyl isobutyl ketone, nitromethane (nitrocarbol), n-pentane, 2-pentanone, 3-pentanone, petroleum ether (light benzine), benzine, propanol, pyridine (azine), tert-butyl methyl ether, tetrachloroethene (perchloroethene), tetrahydrofuran, toluene, trichloroethane, triethylamine, xylene, oxygen, methane, ethane, propane, propene, butane, butene, carbon dioxide, ozone, sulfur dioxide, water.

Examples of inorganic getter materials suitable in accordance with the invention are as follows: cobalt chloride, calcium chloride, calcium bromide, lithium chloride, zinc chloride, zinc bromide, silicas (for example silica gel), aluminum oxide (activated alumina), aluminum sulfate, calcium sulfate, copper sulfate, sodium dithionite, sodium carbonate, sodium sulfate, sodium hydroxide, potassium carbonate, potassium hydroxide, magnesium carbonate, titanium dioxide, kieselguhr, zeolites, barium oxide, calcium oxide, iron oxide; also carbon nanotubes, activated carbon, phosphorus pentoxide, silanes having at least one hydrolysable group in one or more substituents; easily oxidizable metals such as iron, calcium, sodium and magnesium, for example; metal hydrides such as calcium hydride, sodium hydride and lithium aluminum hydride, for example; metal chelates such as aluminum acetylacetonate, for example; sulfites such as potassium disulfite, for example; and also, especially for the binding of oxygen, organometallic oxidation additives based on chelate-forming amines and transition metal complexes, especially in conjunction with oxidizable substrate materials.

In accordance with the invention it is also possible to use mixtures of two or more getter materials.

The getter materials, in accordance with their function, are used preferably in the form of materials free from permeates—in anhydrous form, for example. In accordance with the invention, though, it is also possible to use materials that are already partly complexed with permeates, examples being $CaSO_4 \cdot \frac{1}{2}H_2O$ (calcium sulfate hemihydrate) or silicas, which are present by definition as compounds of the general formula $(SiO_2)_m \cdot nH_2O$.

"Silicas", as described above, are compounds of the general formula $(SiO_2)_m \cdot nH_2O$. This is silicon dioxide prepared by wet-chemical, thermal, or pyrogenic techniques. Suitable getter materials in particular among the silicas are silica gels, examples being silica gels impregnated with cobalt compounds as a moisture indicator (blue gel), and fumed silicas. Of the $SiO_2$ compounds, kieselguhr is also suitable, but is not generally reckoned as among the silicas.

By "silanes" are meant especially compounds of the general formula $R_a$—Si—$X_{4-a}$ or their partial condensation products. In the formula, a is an integer from 0 to 3 and is preferably 0 or 1. X is a hydrolyzable group, as for example and preferably a halogen atom, more particularly chlorine, an alkoxy group such as, for example, a methoxy, ethoxy, n-propoxy, isopropoxy, n-butoxy, sec-butoxy or tert-butoxy group, or an acetoxy group. Other examples, known to the skilled person, of hydrolyzable groups may likewise be employed for the purposes of the present invention. Where two or more substituents X are present, they may be identical or different from one another. R stands for an optionally substituted hydrocarbon radical, as for example for a methyl, ethyl, n-propyl, isopropyl, n-butyl, sec-butyl, tert-butyl group, a pentyl group and also its branched isomers, a hexyl group and also the branched isomers, a heptyl group and also the branched isomers, an octyl group and also the branched isomers, a nonyl group and also the branched isomers, a decyl group and also the branched isomers, an undecyl group and also the branched isomers, a dodecyl group and also the branched isomers, a tetradecyl group and also the branched isomers, a hexadecyl group and also the branched isomers, an octadecyl group and also the branched isomers, or an eicosyl group and also the branched isomers. The hydrocarbon radicals, moreover, may include cyclic and/or aromatic components. Representative structures thereof are cyclohexyl, phenyl, and benzyl groups. The hydrocarbon radical or radicals R optionally comprises or comprise, for example, one or more heteroatom-containing substituents such as amino groups, aminoalkyl groups, glycidyloxy groups, (meth)acryloyloxy groups, and the like. Where two or more substituents R are present, they may be identical or different from one another.

A silane employable as getter material is preferably selected from the group encompassing N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, 3-aminopropyldiethoxymethylsilane, N-(2-aminoethyl)-3-aminopropyldimethoxymethylsilane, (N-butyl)-3-aminopropyltrimethoxysilane, 3-(N-ethylamino)-2-methylpropyltrimethoxysilane, 4-amino-3,3-dimethylbutyltrimethoxysilane, 4-amino-3,3-dimethylbutyldimethoxymethylsilane, (N-cyclohexyl)aminomethyldimethoxymethylsilane, (N-cyclohexyl)aminomethyltrimethoxy-silane, (N-phenyl)-3-aminopropyltrimethoxysilane, (N-phenyl)-aminomethyldimethoxymethylsilane, (N-benzyl-2-aminoethyl)-3-aminopropyltrimethoxysilane, [2-(N-benzyl-N-vinylamino)ethyl]-3-aminopropyltrimethoxysilane hydrogen chloride, [2-(N-benzyl-N-vinylamino)ethyl]-3-aminopropyltrimethoxysilane, bis(3-propyltriethoxysilyl)amine, vinyltrimethoxysilane, vinyltriethoxysilane, vinyltri(2-methoxyethoxy)silane, vinyltriisopropoxysilane, vinyldimethoxymethylsilane, vinyltriacetoxysilane, 3-triethoxysilylpropylsuccinic anhydride, 3-glycidyloxypropyltrimethoxysi lane, 3-glycidyloxypropyltriethoxysilane, 2-(3,4-epoxycyclohexyl)-ethyltriethoxysilane, 3-glycidyloxypropyldiethoxymethylsilane, 3-methacryloyloxypropyltrimethoxysilane, 3-methacryloyloxypropyltriethoxysilane, 3-methacryloyloxypropyltriisopropoxysilane, 3-methacryloyloxypropyldimethoxymethylsilane, 3-methacryloyloxypropyldiethoxymethylsilane, 3-chloropropyltrimethoxysilane, 3-chloropropyltriethoxy-silane, 3-isocyanatopropyltrimethoxysilane, 3-isocyanatopropyltriethoxysilane, isocyanatomethyltrimethoxysi lane, isocyanatomethyldimethoxymethylsilane, tris[3-(trimethoxysilyl)propyl]isocyanurate, 3-ureidopropyltrimethoxysilane, 3-ureidopropyltriethoxy-silane, 2-hydroxy-4-(3-triethoxysilylpropoxy)benzophenone, 4-(3'-chloro-dimethylsilylpropoxy)benzophenone, 3-mercaptopropyltrimethoxysilane, 3-mercapto-propyldimethoxymethylsilane, bis(3-triethoxysilylpropyl)disulfane, bis(3-triethoxy-silylpropyl)tetrasulfane, bis(triethoxysilylpropyl)polysulfane, and octadecylaminodimethyltrimethoxysilylpropylammonium chloride.

The getter material is preferably selected from the group consisting of aluminum oxide, barium, barium oxide, boron trioxide, calcium, calcium chloride, calcium oxide, calcium sulfate, copper sulfate, lithium chloride, magnesium oxide, magnesium perchlorate, magnesium sulfate, phosphoric acid, phosphorus pentoxide, potassium carbonate, potassium hydroxide, silicas, sodium, sodium hydroxide, sodium sulfate, zinc chloride, and zeolites, and mixtures of two or more of the above substances. These materials have a high sorption capacity for at least one of the abovementioned permeates, and more particularly for water as well.

The getter material is more preferably selected from the group consisting of barium, calcium, calcium sulfate, calcium chloride, calcium oxide, sodium sulfate, potassium carbonate, copper sulfate, magnesium perchlorate, magnesium sulfate, lithium chloride, silicas, including especially silica gels and fumed silicas, and zeolites, and also mixtures of two or more of the above substances. These getter materials offer the advantage that they are readily incorporable into matrix materials, exhibit a high sorption capacity and are for the most part regenerable getter materials. By these are meant substances which can give up again, under certain conditions, permeates that they have taken up, water, for example, and consequently enter into a state in which they are capable of renewed permeate uptake. This makes it possible to have a method in which the getter-containing layer or the entire adhesive tape is largely freed, prior to contacting with the adhesive and/or with the bond substrate, from any permeates it has taken up prior to that point in time, this freeing being accomplished by drying, for example. As a result, advantageously, the full getter capacity is available when the adhesive tape of the invention is used.

Very preferably the getter material is selected from the group consisting of calcium oxide, calcium sulfate, calcium chloride, fumed silicas, and zeolites, and also mixtures of two or more of the above substances. These materials have particularly high capacities for the uptake of water and other permeates, are amenable to regeneration, and have outstanding handling qualities.

More particularly the getter material is calcium or calcium oxide. These substances provide indications of the permeate content of the adhesive via a change in their visual properties, by reacting to increasing water uptake, for example, by undergoing a change from white (calcium oxide) or metallically opaque (calcium) to a transparent appearance. Therefore, as long as free getter capacity is still in evidence from the visual appearance of the getter material, this may be taken as an indication that so far little permeate, if any, is as yet present in the material to be protected.

In one embodiment of the invention, the layer B of the adhesive tape of the invention is a continuous layer which to an extent of at least 95 wt %, more preferably at least 99 wt %, based on the total weight of the layer B, comprises one or more getter materials. With particular preference in accordance with the invention, provision is made for the continuous layer to consist of the getter material, disregarding minor impurities. Layers of this kind may be provided, for example, by means of vacuum coating with metallic getter materials or their oxides on at least one of the layers A and C of adhesive. A construction of this kind has the advantage that the getter material is consolidated in itself and therefore that a good join comes about on the part of the two layers of adhesive.

A continuous layer here means a layer in which no deliberate apertures are made during production. Any apertures there may be result from defects in the layer or in the manner of layer formation. In this sense, for example, a layer scattered on from particles, in which the particles are present in random distribution, is considered continuous, even if the geometry of the particles in a monolayer means that they have open interstices. In accordance with the invention, a layer is deemed to be continuous if the average area of the apertures is not greater than 2000 µm².

Layers applied by vapor deposition as well, for which in general the layer grows together from clusters, are considered continuous if the optical density is greater than 50%.

In a further embodiment, the layer B is a perforated layer, comprising one or more getter materials to an extent of at least 95 wt %, more preferably at least 99 wt %, based on the total weight of the layer B. With particular preference in accordance with the invention, provision is made for the perforated layer to consist of the getter material, with minor impurities being disregarded. Perforated getter layers—also termed open layers—may be provided, for example, by vacuum coating using masks, or by means of printing or flocking of metallic getter materials or their oxides on at least one of the layers A and C of adhesive, using masks. The advantage of this construction is that the two layers of adhesive can come into contact with one another at the perforation sites, meaning that a high internal strength of the assembly can be achieved.

A perforated or open layer is understood to be a layer in which apertures are made deliberately in the course of production. A layer is deemed open in accordance with the invention if the average area of the apertures is greater than 2000 µm', since in that case the layers of adhesive can easily come into contact at the perforation sites.

Where the getter-containing layer is present as a continuous or perforated layer in the construction of the adhesive tape, its thickness is sensibly limited preferably by the adhesive tape requirements. 2000 µm may therefore be taken as an upper limit on the thickness of a layer of this kind. The layer thickness is preferably 200 nm to 100 µm. Within this range, advantageously, defined properties can be specifically realized. Where, for example, the aim in particular is for a high permeate uptake capacity in conjunction with sufficient adhesive tape flexibility to be realized, the layer thickness is more preferably 10 µm to 100 µm. Where high flexibility on the part of the adhesive tape is required in conjunction with sufficient getter capacity, a layer thickness of between 200 nm and 10 µm is preferred, more particularly a thickness of 500 nm up to 5 µm. In order to be able to have getter capacity which can be utilized effectively from a technical standpoint, a thickness of 50 nm is regarded preferably as a lower limit. For a very high flexibility on the part of the adhesive tape, albeit with a low getter capacity, a layer thickness of 50 nm to 200 nm is preferred.

In principle with preference the thickness of the getter-containing layer B is generally at least 50 nm, preferably at least 100 nm, more preferably at least 200 nm, and more particularly at least 500 nm.

In a further embodiment of the invention, the getter material is in particulate form in the layer B. This means that the getter material is present, in the sense of DIN 53206-1: 1972-08, in the form of primary particles, aggregates and agglomerates.

The size of the getter particles is limited or determined essentially by the requirements in terms of the thickness of the particle-containing layer or of the adhesive tape of the invention as a whole. Around 2000 µm may be taken to be an upper limit on the particle size. The maximum particle size of the getter material is preferably 100 µm. The "particle size" in this context means the maximum extent of a particle. The particle size is determined preferably by means of laser diffraction in accordance with ISO 13320 (but dispersing agglomerates, not aggregates, in the dispersing step), although other techniques known to the skilled person are suitable in principle as well.

In one particularly preferred embodiment, the getter material is in particulate and nanoscale form. This means that the maximum particle size is less than 500 nm, preferably less than 200 nm, more particularly less than 100 nm.

With preference the getter material is in particulate form in the layer B and is partially surrounded by a matrix material. A "matrix material" means a material which partially or completely envelops getter material present, especially particulate getter material, and which is different from the material of the layers A and C of adhesive. The embodiment with a matrix material surrounding the getter material therefore differs from a construction of the adhesive tape of the invention wherein the material of the layers A and/or C of adhesive at least partially envelops the getter material, by virtue of the fluidity of the adhesives, but where the enveloping material is not different from the material of the layers A and C of adhesive.

In one advantageous version, the matrix material is a polymer composition, preferably a PSA, more preferably a photopolymerized polyacrylate PSA or a thermally cross-linked polyacrylate PSA that is processed from the melt. By this means it is possible to optimize the properties of the various layers of PSA for their function within the assembly. For example, the PSA for the matrix material may permit particularly easy dispersion of the getter material, or may be especially pervious to permeates, to allow them to reach the getter material quickly.

A particularly advantageous version of the PSA is as a viscoelastic carrier, based for example on thermally cross-linkable polyacrylates processed from the melt, as described in WO 2008/122489 A1, DE 102008052625 A1 or DE 102008059050 A1, or based on photopolymerizable acrylates, as described in U.S. Pat. Nos. 4,150,170, 4,181,752, 4,330,590, 4,379,201, 4,391,687 or EP 0 573 570 B1. With this kind of a version of the adhesive tape, a very high bonding performance can be achieved.

Where the getter material is present in a matrix, the layer comprising the getter material, layer B, is preferably 1 µm to 3000 µm thick. If only a low uptake capacity is needed or if the adhesive tape is to be extremely flexible, preference is given to a thickness of 1 to 100 µm. Where a high uptake capacity is required, a thickness of 500 to 3000 µm is preferred.

The inorganic getter material may be present for example in a carrier, preferably in the pores of a porous carrier material. In this case the getter material does not fill out the pores completely, but is instead merely fixed—geometrically, for example—therein, so that the getter-filled carrier material is highly gas-permeable. The advantage of this is that inwardly migrating permeates are able to reach the getter material very quickly and at the same time a high internal strength of the layer assembly can be achieved through the carrier material. Porous carrier materials are also particularly suitable for the uptake of liquid getter materials.

Porous carrier material used may take the form, for example, of sheetlike textile structures, closed-cell and open-cell foams, or papers. With particular preference, however, the porous carrier with getter material present therein is an extruded and stretched film, based for example on polyolefin, as is described in EP 0 232 060 A2. Accordingly, a gas-permeable, porous film of this kind is produced essentially in the following steps:
 a) mixing of a polymer resin and of an inorganic getter material,
 b) shaping of a film from the mixture, and
 c) stretching of the resulting film in order to develop the porosity.

The selection of a polyolefin as polymer resin results in only a weak anchorage between the two materials, owing to the differences in polarity relative to the inorganic getter material. During stretching, this connection is at least partly undone, causing pores to form around the dispersed getter particles, these pores being distinguished by particularly good accessibility of the getter material for permeates. After stretching, therefore, the getter material is no longer completely enveloped by matrix material. Through the choice of a film as carrier material, moreover, the structure advantageously has good diecutting and application qualities. The stretched film filled with inorganic getter material preferably has a thickness of less than 10 µm, more preferably of less than 5 µm. This has the advantageous effect of allowing the development of relatively high flexibility on the part of the adhesive tape of the invention.

Sheetlike textile structures are understood to encompass flexible fiber structures, such as, for example, wovens, scrims, formed-loop knits, drawn-loop knits, nonwovens (consolidated and unconsolidated), and meshes.

The layer comprising the getter material present in a carrier may comprise 0.5 to 98 wt % of getter material. Preferably the layer comprises 3 to 85 wt %, more preferably 10 to 60 wt %, of getter material, based in each case on the total weight of the layer. It has emerged that within this proportional range, on the one hand good getter capacities can be realized and on the other hand the mechanical properties of the layer are adequately maintained.

Likewise preferably, the getter material in a carrier is present in the form of particles in a particle size distribution in which at least 10 vol % exceeds the average layer thickness of the carrier layer containing getter material. This results in a rough surface and may improve the anchorage of the various layers in the layer assembly of the adhesive tape of the invention. With particular preference the entire getter material present in the adhesive tape of the invention is present in a particle size distribution in which at least 10 vol % exceeds the average layer thickness of the layer or layers containing getter material.

The total getter material content of the adhesive tape of the invention may be from 0.5 to 95 wt %, based on the total weight of the adhesive tape. This content is dependent essentially on the desired uptake capacity for the respective permeate or permeates.

If, for example, only a low uptake capacity is needed, it may be sufficient to use a getter material with a low uptake capacity in a small amount. In one preferred embodiment, therefore, the adhesive tape comprises 0.5 to 30 wt % of getter material, based on the total weight of the adhesive tape. In this case the thickness and the area of the getter-containing layer or layers may be situated advantageously at the respective lower limits.

In the case where the required uptake capacity of the adhesive tape is very high, however, it is necessary to use a layer containing getter material that has a relatively high getter material content, and the getter material ought to possess a high uptake capacity as well. However, a getter material with a low uptake capacity can also be used if this is advisable from considerations of cost or compatibility. In a further preferred embodiment of the adhesive tape of the invention, therefore, the tape comprises 50 to 95 wt % of getter material, based on the total weight of the adhesive tape.

In its application form—that is to say, for example, as continuous or perforated layer, as particulate material, etc.— the getter material preferably has a minimum permeate uptake capacity, especially for water and/or oxygen, more preferably for water, of 1%, more preferably of 2%, very preferably of 5%, more particularly of 10% of its own weight. Preference is given in particular to a getter material with a high uptake capacity (maximum weight of permeate that can be taken up >20% of the getter weight), since this allows the getter content to be kept low. The uptake capacity here is determined after storage of the substantially permeate-free getter material in its application form for 100 hours at 23° C. and 50% relative atmospheric humidity for water vapor as the permeate, or at 23° C. in a saturated atmosphere in the case of other gaseous permeates. The permeate content of the getter after storage can be determined gravimetrically. From the standpoint of uptake capacity, the getter material is preferably selected from the group encompassing copper sulfate, calcium oxide, calcium chloride, and zeolites, and also mixtures of these materials.

The getter material or materials may be introduced into the relevant layer or layers by means of any of the techniques that are known to the skilled person. The getter material here may be present in solution, in dispersion, as a melt, or as a fluid.

Besides the getter material and optionally the carrier material, the layer B comprising getter material may comprise further materials and/or substances, examples being light-absorbing or light-scattering materials, UV absorbers or UV reflectors, color indicators which indicate saturation of the getter material, aging inhibitors and/or tackifiers, more particularly tackifier resins.

The layer comprising getter material may be applied directly by means of coating techniques known to the skilled person, such as using a coating bar, for example, from solution, emulsion, or dispersion. The solution, emulsion or dispersion medium used may in that case be subsequently evaporated in a commercial drying tunnel. Solvent-free coating is also suitable, by means of scattering, flocking or powdering processes, for example.

In accordance with the invention, the layer comprising getter material may also be printed. In accordance with the prior art, gravure and screen printing processes are suitable for this purpose. Preference in that case is given to employing rotary printing processes. Furthermore, layers containing getter material may also be applied by spraying, optionally also with electrostatic assistance.

The adhesive tape of the invention, between the outer layers A and C of adhesive, may comprise not only the layer B but also one or more further layers, which comprise at least one inorganic getter material. These further layers may be the same or different and may conform in their structure to the above-described layers containing getter material.

Furthermore, the further getter material-containing layers may be in direct contact with the layer B and/or with one another, or may be present separated from one another by means of at least one further layer that contains no getter material. This further layer containing no getter material may be a layer of adhesive or a carrier layer, for example.

Besides the layers A, B, and C, the adhesive tape of the invention preferably comprises an additional carrier layer which contains no getter material and is disposed between the layers A and C. Examples of suitable materials for an additional carrier layer of the adhesive tape of the invention include textile materials, papers, plastic-coated papers, and films. The additional carrier layer is preferably a film and as such is more preferably a dimensionally stable polymeric film. An additional carrier layer of this kind has the advantageous effect of improving the application and diecutting properties of the adhesive tape. A dimensionally stable polymeric film as carrier layer comprises preferably polyesters as base material, more particularly polyethylene terephthalate, examples being biaxially oriented polyethylene terephthalate; polyolefins, especially polybutene, cycloolefin copolymers, polymethylpentene, polypropylene and/or polyethylene, examples being monoaxially oriented polypropylene, biaxially oriented polypropylene and/or biaxially oriented polyethylene.

An advantage of polyester films is that they ensure temperature stability and introduce an increased mechanical stability. With very particular preference, therefore, the base material of the carrier layer is a polyester, as for example biaxially oriented polyethylene terephthalate. "Base material" means the major constituent of the relevant layer and/or film, it being possible for this layer to include minor amounts of auxiliaries. The base material is normally present in the layer in question at a fraction of at least 80 wt %.

Furthermore, the adhesive tape of the invention preferably comprises a barrier layer against one or more specific permeates, more particularly against water vapor and oxygen. A barrier function of this kind can consist of organic or inorganic materials.

The adhesive tape of the invention very preferably comprises at least one inorganic barrier layer. Particularly suitable as inorganic barrier layers are metals deposited well under vacuum (as for example by means of vapor deposition, CVD, PVD, PECVD) or under atmospheric pressure (as for example by means of atmospheric plasma, reactive corona discharge or flame pyrolysis), examples being aluminum, silver, gold, nickel and/or metal compounds such as metal oxides, nitrides or hydronitrides, as for example oxides or nitrides of silicon, of boron, of aluminum, of zirconium, of hafnium, or of tellurium, or indium tin oxide (ITO). Likewise suitable are layers of the aforementioned variants that are doped with further elements.

In order to ensure sufficient flexibility in conjunction with avoidance of cracking in the inorganic barrier layer, such layers are in general thinner than about 50 nm. Consequently, and in view of the great compactness, the intention being, indeed, to prevent permeation, such layers are not themselves suitable as getter layers, since they do not offer adequate uptake capacity for permeates.

Besides the layers A, B and C, the adhesive tape of the invention more preferably comprises at least one carrier layer and at least one barrier layer against one or more permeates, the barrier layer and the carrier layer taking the form of layers directly following one another and disposed between the layers A and C. Particularly suitable techniques for applying an inorganic barrier layer are high-power impulse magnetron sputtering and atomic layer deposition, through which particularly permeation-proof layers can be realized in conjunction with minimal temperature loading of the carrier layer. Preference is given to a permeation barrier of the barrier layer or of the assembly of carrier layer and barrier layer with respect to water vapor (WVTR) of <1 $g/(m^2 \cdot d)$ and/or against oxygen (OTR) of <1 $cm^3/(m^2 \cdot d \cdot bar)$, the figure being based on the carrier layer thickness used in the adhesive tape in each case, and therefore not standardized to a specific thickness. Here, the WVTR is measured at 38° C. and 90% relative atmospheric humidity in accordance with ASTM F-1249, and the OTR at 23° C. and 50% relative atmospheric humidity in accordance with DIN 53380-Part 3.

The adhesive tape of the invention may be lined with a release liner on each of its outsides. A release liner, however, is not considered part of the adhesive tape, but merely represents an aid to its production, storage and/or further processing.

The adhesive tape of the invention is preferably transparent, meaning that the transmittance measured according to ASTM D1003-00 (Procedure A) is greater than 50%, preferably greater than 75%. With transparency, the adhesive tape can be more easily positioned in the application, and can be used for at least partial overbonding of the electronic construction in applications requiring transparency, examples being light-emitting electronic constructions or solar cells.

With particular preference, the adhesive tape of the invention is impervious to UV light, meaning that the transmittance in a wavelength range from 200 to 400 nm, measured according to ASTM D1003-00 (Procedure B), is less than 25%, preferably less than 10%. With a UV-impervious adhesive tape, an electronic construction can be protected from alterations (for example, chemical reactions, aging, crosslinking) resulting from the influence of UV light.

In one specific version, the adhesive tape of the invention comprises only layers A, B and C; layer B in this construction is preferably a layer of inorganic getter material, in other words not a carrier material and also not a matrix material embedding the getter material (adhesive transfer tape), since in this way it is possible to keep the construction simple and to minimize the number of possible permeates to be considered, by virtue of the reduced diversity of materials. With an embodiment of this kind, the layers B and A, and/or C, are in immediate contact through one another. Where the adhesive tape additionally includes primer layers between A and B and/or between B and C, such layers are preferably not thicker than 1 µm. The result is easy accessibility of the getter materials for the permeates.

The thickness of the adhesive tape of the invention may encompass all customary thicknesses, in other words, for instance, from 3 µm up to 3000 µm. A thickness between 25 and 100 µm is preferred, since bond strength and handling properties are particularly positive within this range. A further preferred range is a thickness of 3 to 25 µm, since in this range the amount of substances permeating through the bondline can be kept low solely by virtue of the small cross-sectional area of the bondline in an encapsulation application.

Exemplary variants of the construction of an adhesive tape of the invention are shown in FIGS. 1 to 12. The figures are purely diagrammatic and not drawn to scale. Signification within the figures is as follows:
10, 11: layer of adhesive
20-25: layer comprising getter material
30: carrier layer
40, 41: release liner
50: inorganic barrier layer

Figure 1:
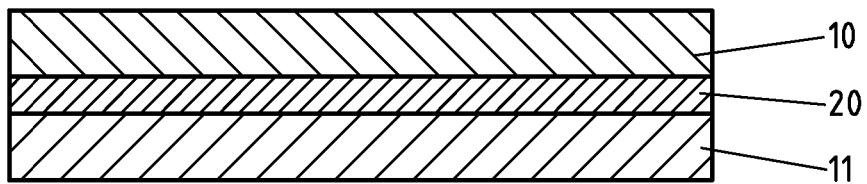
FIG. 1 shows an adhesive tape which consists of two layers 10, 11 of adhesive and also a continuous layer 20 of inorganic getter material in between them.
Figure 2:
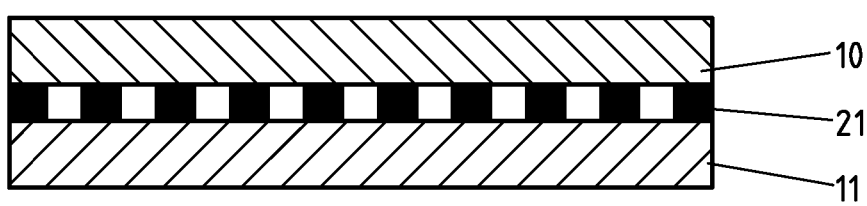
FIG. 2 shows an adhesive tape which consists of two layers 10, 11 of adhesive and also a perforated layer 21 of inorganic getter material in between them.
Figure 3:
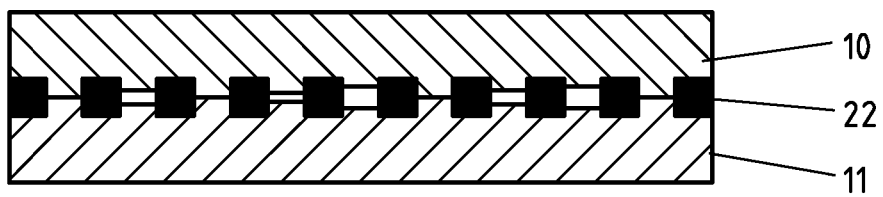
FIG. 3 shows an adhesive tape which consists of two layers 10, 11 of adhesive and also a perforated layer 22 of inorganic getter material in between them, with the adhesives penetrating the layer of getter material and at least partly surrounding it.
Figure 4:
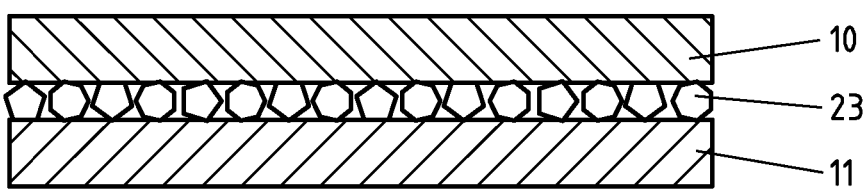
FIG. 4 shows an adhesive tape which consists of two layers 10, 11 of adhesive and also a layer 23 of particulate inorganic getter material in between them.
Figure 5:
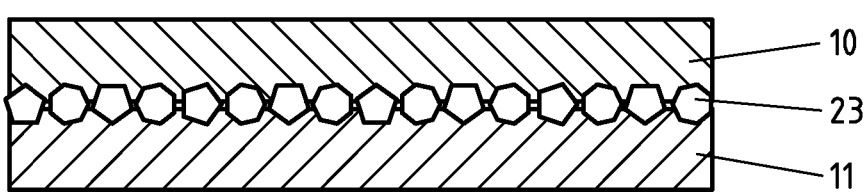
FIG. 5 shows an adhesive tape which consists of two layers 10, 11 of adhesive and also a layer 23 of particulate inorganic getter material in between them, with the adhesives penetrating the layer of getter material and at least partly surrounding it.
Figure 6:
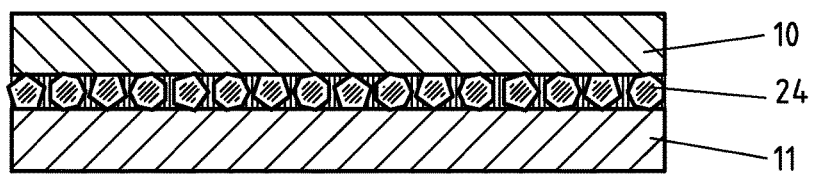
FIG. 6 shows an adhesive tape which consists of two layers 10, 11 of adhesive and also a layer 24 of particulate inorganic getter material in between them, the getter material being embedded in a stretched polymer matrix. The matrix material does not fully wet the getter particles (not shown explicitly in the figure), but only partly if at all. The resulting porosity therefore allows the permeates to easily reach the surface of the getter material.
Figure 7:
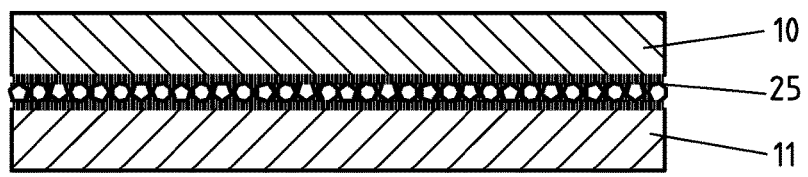
FIG. 7 shows an adhesive tape which consists of two layers 10, 11 of adhesive and also a layer 25 of particulate inorganic getter material in between them, the getter material being embedded loosely in a sheetlike textile structure.
Figure 8:
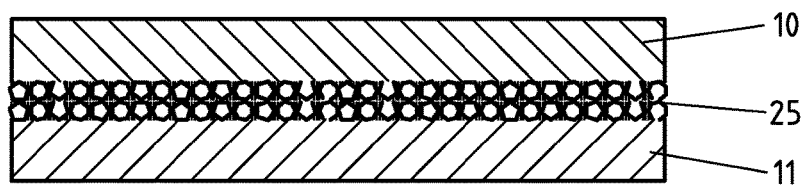
FIG. 8 likewise shows an adhesive tape which consists of two layers 10, 11 of adhesive and also a layer 25 of particulate inorganic getter material in between them, the getter material being embedded loosely in a sheetlike textile structure.
Figure 9:
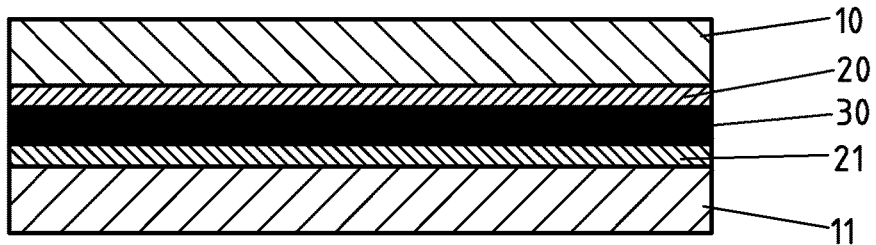
FIG. 9 shows an adhesive tape which consists of two layers 10, 11 of adhesive and also two continuous layers 20, 21 of inorganic getter material in between them, the layers 20 and 21 being applied each on one side of a continuous carrier material 30.
Figure 10:
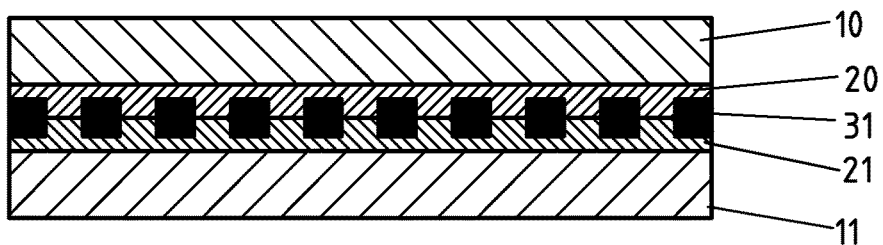
FIG. 10 shows an adhesive tape which consists of two layers 10, 11 of adhesive and also two continuous layers 20, 21 of inorganic getter material in between them, the layers 20 and 21 being applied each on one side of a perforated carrier material 31.
Figure 11:
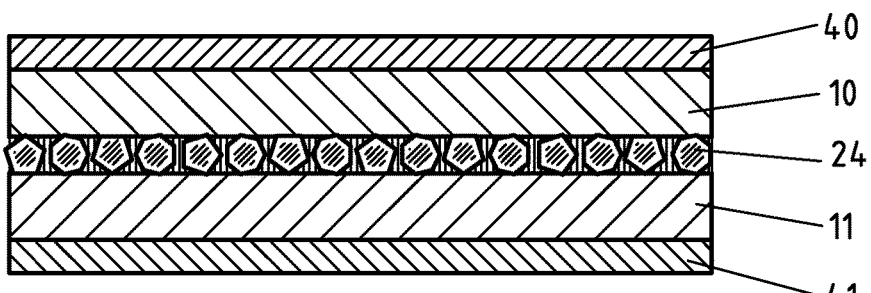
FIG. 11 shows an adhesive tape which consists of two layers 10, 11 of adhesive and also a layer 24 of particulate inorganic getter material in between them, the getter material being embedded in a stretched polymer matrix and the adhesives being lined with release liners 40, 41.
Figure 12:
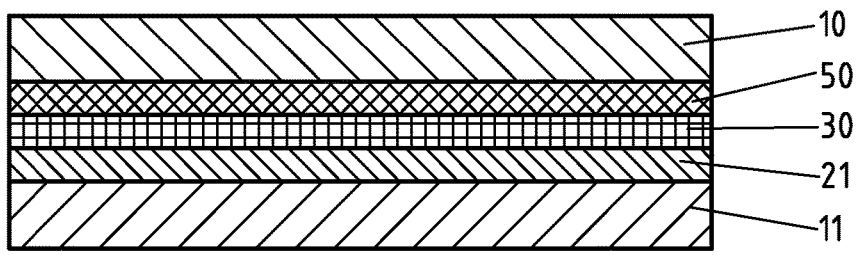
FIG. 12 shows an adhesive tape which consists of two layers 10, 11 of adhesive and also a continuous layer 20 of inorganic getter material in between them and also an inorganic barrier layer 50, the layer 20 being applied on one side and the inorganic barrier layer 50 being applied on the other side of a continuous carrier material 30.

A further subject of the invention is a process for producing an adhesive tape of the invention, said process comprising the following steps:
 providing a first layer A of adhesive;
 applying a layer B comprising at least one inorganic getter material to the layer A, by coating or laminating, for example;
 covering the free side of the layer B with a further layer C of adhesive, by coating or laminating, for example.

An alternative embodiment of the process for producing an adhesive tape of the invention comprises the following steps:
 providing an auxiliary carrier, as for example an abhesive liner, an abhesive web or roll;
 applying a layer B comprising at least one inorganic getter material;
 covering the layer B with a first layer A of adhesive, by means of coating or laminating, for example;
 detaching the assembly from the auxiliary carrier and covering the exposed surface with a second layer C of adhesive, by coating or laminating, for example.

The processes of the invention take place preferably within an environment in which the specific permeate is present only at a low concentration or essentially not at all. For the case of water (vapor) as permeate, an example might be a relative atmospheric humidity of less than 30%, preferably less than 15%.

A further subject of the invention is the use of calcium and/or calcium oxide to indicate the permeate content of an adhesive and/or of an adhesive tape. With increasing binding of water, accordingly, calcium oxide changes its color from white to transparent. Metallic calcium as well, with increasing uptake of water, loses its metallically opaque appearance and becomes increasingly transparent. So as long as getter material can still be seen in the visual appearance of the unspent state, this may be taken as an indication that as yet no permeate, or at most little permeate, has diffused into the adhesive that is to be protected.

A further subject of the invention is the use of an adhesive tape of the invention as encapsulation material, more particularly for the protection of electronic arrangements, foods and/or drugs. An adhesive tape of the invention is outstandingly suitable for encapsulating an electronic arrangement with respect to permeates, by the application of the adhesive tape to and/or around those regions of the electronic arrangement that are to be encapsulated. Besides the optoelectronic arrangements already mentioned, use is similarly advantageously possible in other electronic arrangements such as electrochemical cells, e.g., fuel cells or electrolysis cells, and/or batteries. In the region of packaging as well, especially the packaging of foods or drug packaging, adhesive tapes of the invention are highly suitable.

Encapsulation in the present context refers not only to complete enclosure of the region to be encapsulated, but even just regional application of an adhesive tape of the invention to those regions to be encapsulated of an electronic arrangement in particular, as for example a single-sided covering or encasing of an electronic structure.

In principle, two modes of encapsulation can be carried out with adhesive tapes. Either the adhesive tape is diecut or cut to shape beforehand, and bonded only around the regions that are to be encapsulated, or it is bonded over the full area of the regions to be encapsulated. An advantage of the second variant is the greater ease of handling and the often better protection.

EXAMPLES

Various adhesive tapes filled with getter material were produced. They were laminated from various layers by means of a laboratory roll laminator in a controlled-climate chamber at 23° C. and a relative atmospheric humidity of 50%.

Layers of Adhesive:

To produce layers of adhesive, different adhesives were applied from solution to a conventional liner of type SILPHAN S75 M371 (silicone coated PET) from Siliconature, using a laboratory coating device, and were dried. The thickness of the layer of adhesive after drying was 12 µm in each case. Drying took place in each case at 120° C. for 30 minutes in a laboratory drying cabinet. The indication of "parts" in the listing below denotes "parts by weight".

| K1: Pressure sensitive adhesive | | |
|---|---|---|
| 100 parts | Tuftec P 1500 | SBBS with 30 wt % block polystyrene content, from Asahi. The SBBS contains about 68 wt % diblock content. |
| 100 parts | Escorez 5600 | Hydrogenated HC resin with a softening point of 100° C., from Exxon |
| 25 parts | Ondina 917 | White oil composed of paraffinic and naphthenic fractions, from Shell |

The solvent used was a mixture of toluene and acetone in a ratio of 2:1

| K2: Hotmelt adhesive | | |
|---|---|---|
| 100 parts | Kraton FG 1924 | Maleic anhydride-modified SEBS with 13 wt % block polystyrene content, 36 wt % diblock, and 1 wt % maleic acid from Kraton |
| 25 parts | Escorez 5600 | Hydrogenated HC resin with a softening point of 100° C., from Exxon |
| 1 part | Aluminum acetylacetonate | |

The solvent used was a mixture of toluene and acetone in a ratio of 2:1

| K3: Radiation-activatable hotmelt adhesive | | |
|---|---|---|
| 25 parts | Epiclon 835 LV | Bisphenol A and bisphenol F-based epoxy resin from DIC, Japan, molecular weight $M_w$ about 350 g/mol |
| 25 parts | Epicote 1001 | Bisphenol-based epoxy resin from Mitsubishi Chemical Company, Japan, molecular weight $M_w$ about 900 g/mol |
| 50 parts | YP-70 | Bisphenol A and bisphenol F-based phenoxy resin from Nippon Steel Chemical Group, Japan, molecular weight $M_w$ about 55 000 g/mol |
| 1.5 parts | Irgacure 250 | Iodonium salt-based UV photoinitiator from BASF (iodonium, (4-methylphenyl) [4-(2-methylpropyl)phenyl]-, hexafluorophosphate(1-)) |

The solvent used was methyl ethyl ketone.

| K4: Heat-activatable adhesive | | |
|---|---|---|
| 90 parts | Ultramid 1C | Copolyamide 6/66/136 from BASF with a viscosity number in 96% strength sulfuric acid according to ISO 307 of 122 ml/g |
| 10 parts | EPR 166 | Bisphenol-based epoxy resin from Bakelite, epoxide number of 184 |
| 20 parts | PEG 2000 | Polyethylene glycol with average molar mass of 2000 |
| 20 parts | Foralyn 5040 | Tackifier resin from Eastman |

The adhesive was produced in an operation as set out in DE 102006047739 A1 with ethanol as solvent.

The layers of adhesive were stored at 23° C. and 50% relative atmospheric humidity for 72 hours (conditioning A). The water content of the layers of adhesive was determined in each case prior to combination with the getter material.

Measurement of Water Content

The water content was determined in accordance with DIN 53715 (Karl-Fischer titration). The measurement was made on a Karl-Fischer coulometer 851 in conjunction with an oven sampler (oven temperature 140° C.). A triple determination was carried out with an initial mass of around 0.3 g in each case. The water content reported is the arithmetic mean of the measurements.

Measurement of Water Vapor Permeation Rate

The WVTR is measured at 38° C. and 90% relative atmospheric humidity in accordance with ASTM F-1249 and is standardized for a thickness of 50 µm.

| Layer of adhesive | Water content [ppm] conditioning A | Water vapor permeation rate [g/m² d] |
|---|---|---|
| K1 | 853 | 37 |
| K2 | 551 | 22 |
| K3 | 3216 | 32 |
| K4 | 16400 | 220 |

In addition, specimens of the layer of adhesive 1 were also dried for only 5 minutes at 120° C. The residual solvent content remaining was determined immediately after drying.

Determination of Residual Solvent Content:

The residual solvent content of the adhesives was determined by means of headspace gas chromatography. A sample with an area of about 12.5 cm² was cut from the swatch specimen, adhered to a metal wire spiral, and transferred to a headspace sample vial measuring around 22 ml.

The samples were measured using a Dani GC 86.10 gas chromatograph with Quma QHS-S40 autosampler. The samples were conditioned in the instrument at 120° C. for 1 hour. Detection took place using a flame ionization detector (FID). The peaks in the GC were quantified against external standards.

| Layer of adhesive | Residual solvent content [mg/m²] (based on 25 μm layer thickness) |
|---|---|
| K1 (5 min drying) | 102 |

Production of Matrices Comprising Getter Material:

Matrix Layer with Incompletely Embedded Getter Material (Getter Material Partly Surrounded by Matrix Material)

The polypropylene polymers Inspire D 404.01 and 7C06 from Dow were mixed in a ratio of 1:1 and extruded. The mixture is identified below as "PP matrix". The film was produced in a layer on a twin-screw extrusion unit from Coperion (d=25 mm, L/d=37) with flange-connected flat die, followed by a chill roll station. The getter material was supplied by means of a side feeder after the melting and homogenizing of the polymer components in an amount of 30 wt %.

The die temperature was 235° C., the chill roll temperature 85° C. After cooling, the film was clamped into a simultaneous laboratory stretching frame and stretched simultaneously in an oven at a temperature of 150° C. in two directions at right angles to one another within the film plane. The stretching ratio in both directions was about 1:7. The film had a final thickness of about 30 μm.

The film produced was tested for its water vapor permeability at 38° C. and 90% relative atmospheric humidity in accordance with ASTM F-1249. For a measurement area of 10 cm², values above the upper limit of the instrument, of 1000 g/m², were obtained, enabling the conclusion that pores have formed around the getter particles as intended.

Matrix Layer with Embedded Getter Material (Getter Material Surrounded by Matrix Material)

As a further example, the film extruded as above was pressed in a Lauffer vacuum press at a temperature of 230° C. to give a film having a weight per unit area of 30 g/m².

The film produced was measured for its water vapor permeability at 38° C. and 90% relative atmospheric humidity in accordance with ASTM F-1249. After the establishment of the equilibrium state (saturation of the getter material beforehand), a water vapor permeability of 43 g/m²d was found. As expected, therefore, the getter material was completely surrounded by the matrix material.

Immediately after their production, the getter-filled carrier layers were welded into vacuum-treated pouches of a permeation-impervious film laminate (polyester film/aluminum foil/sealing adhesive film), stored under a nitrogen atmosphere in a glovebox, and not removed until immediately before use.

Getter Materials Used:

| Designation | Description | Trade name | Supplier |
|---|---|---|---|
| G1 | Calcium oxide | Calcium oxide nanopowder | Sigma-Aldrich |
| G2 | Lithium chloride | Lithium chloride anhydrous | Sigma-Aldrich |
| G3 | Calcium | High-purity calcium granules | Osnabruegge |
| G4 | Barium | High-purity barium granules | Osnabruegge |
| G5 | Zeolite 13X | Molecular Sieves, 13X powder | Sigma-Aldrich |

Production of Adhesive Tapes:

The adhesive tapes were produced in a dry environment at 23° C. and approximately 20% relative humidity.

Adhesive tapes with the powder-form getter materials G1, G2, and G5 were produced by using a screen to scatter a quantity of approximately 2 g/m² to one side of a layer of adhesive. The second layer of adhesive was then laminated onto the scattered side, by means of a laboratory laminating device, at the temperature reported in each case below.

As a comparative example, the same amount of getter material was dispersed into the dissolved adhesive, which had been freed beforehand from water using zeolite beads from Sigma-Aldrich, and the adhesive was coated out and dried as described above. Here a layer of adhesive with a thickness of 25 μm was produced.

For adhesive tapes with the metallic getter materials, the metal was applied by vapor deposition, producing in each case a getter material layer thickness of approximately 300 nm.

In one instance, one side of the layer of adhesive was vapor-coated, and the vapor-coated side was then laminated to the second layer of adhesive.

In the other instance, a carrier film was vapor-coated with the getter material. This carrier film was laminated on both sides to one layer of adhesive in each case, as indicated above.

The carrier film used was a polyester film having a thickness of approximately 12 μm and a coating of an inorganic barrier layer approximately 40 nm thick (GX-P-F from Toppan Printing, hereinafter called "barrier PET"), with the getter material layer being applied on the side of the polyester film opposite from the inorganic barrier layer.

For adhesive tapes with a matrix layer comprising the getter material, the matrix layer was laminated on both sides with the layer of adhesive indicated in each case.

Table 1 shows an overview of the adhesive tapes produced containing getter material:

TABLE 1

Getter material-filled adhesive tapes

| Example | Adhesive 1 | Carrier material | Getter material | Matrix material | Adhesive 2 | Laminating temperature [° C.] |
|---|---|---|---|---|---|---|
| 1 | K1 | — | G1 | — | K1 | 60 |
| 2 | K1 | — | G2 | — | K1 | |
| 3 | K1 | — | G3 | — | K1 | |
| 4 | K1 | — | G4 | — | K1 | |
| 5 | K1 | — | G1 | PP | K1 | |
| 6 | K1 | — | G2 | PP | K1 | |
| 7 | K1 | barrier-PET | G3 | — | K1 | |
| 8 | K2 | — | G1 | — | K2 | 120 |
| 9 | K2 | — | G2 | — | K2 | |
| 10 | K2 | — | G3 | — | K2 | |
| 11 | K2 | — | G4 | — | K2 | |
| 12 | K2 | — | G1 | PP | K2 | |
| 13 | K2 | — | G2 | PP | K2 | |
| 14 | K2 | barrier-PET | G3 | — | K2 | |
| 15 | K3 | — | G1 | — | K3 | 100 |
| 16 | K3 | — | G2 | — | K3 | |
| 17 | K3 | — | G3 | — | K3 | |
| 18 | K3 | — | G4 | — | K3 | |
| 19 | K3 | — | G1 | PP | K3 | |
| 20 | K3 | — | G2 | PP | K3 | |
| 21 | K3 | barrier-PET | G3 | — | K3 | |
| 22 | K4 | — | G1 | — | K4 | 100 |
| 23 | K4 | — | G2 | — | K4 | |

TABLE 1-continued

Getter material-filled adhesive tapes

| | Adhesive 1 | Carrier material | Getter material | Matrix material | Adhesive 2 | Laminating temperature [° C.] |
|---|---|---|---|---|---|---|
| 24 | K4 | — | G3 | — | K4 | |
| 25 | K4 | — | G4 | — | K4 | |
| 26 | K4 | — | G1 | PP | K4 | |
| 27 | K4 | — | G2 | PP | K4 | |
| 28 | K4 | barrier-PET | G3 | — | K4 | |
| 29 | K1* | — | G5 | — | K1* | 60 |
| 30 | K1 | — | G1 | PP | K1 | 60 |
| 31 | K1 | — | G2 | PP | K1 | 60 |
| Comparative examples | | | | | | |
| C1 | — | — | G1 | K1 | — | — |
| C2 | — | — | G2 | K1 | — | — |
| C3 | — | — | G5 | K1* | — | — |

*brief drying, with residual solvent

For Examples 1, 2, 5, 6 and 29-31 and also for Comparative Examples C1-3, the bond strengths to steel were determined in analogy to ISO 29862 (method 3) at 23° C. and 50% relative atmospheric humidity with a take-off speed of 300 mm/min and a peel angle of 180°. The reinforcing film used was an etched PET film with a thickness of 50 μm, as available from Coveme (Italy).

The measuring strip here was bonded at a temperature of 60° C. using a laboratory laminator. Table 2 shows the results.

For further investigation, adhesive tape sections measuring about 100×100 mm$^2$ were lined on both sides with a permeation-impervious liner of type Alu I 38 UV1 from Mondi, including an aluminum foil carrier. Lamination took place at a temperature of 100° C. in order to allow close conformation of the liner. The liner therefore prevents water permeating from the adhesive tape into the glovebox during storage.

The specimens were stored in the glovebox under the stated conditions for a period of 14 days.

Finally, the water content and/or toluene content of the adhesive in the specimens was ascertained. Samples here were taken from the middle of the specimen area, in order to avoid edge effects. Getter, carrier or matrix materials present were not removed. The assumption is that regeneration of the getter and hence release of permeates takes place only at significantly higher temperatures than those used for measurement. The results are summarized in Table 2:

TABLE 2

Testing of the drying of the layers of adhesive and their adhesive properties

| Example | Water content [ppm] | Bond strength [N/cm] |
|---|---|---|
| 1 | 480 | 6.1 |
| 2 | 215 | 6.0 |
| 3 | 459 | |
| 4 | 632 | |
| 5 | 104 | 6.5 |
| 6 | 87 | 6.5 |
| 7 | 734 | |
| 8 | 320 | |
| 9 | 80 | |
| 10 | 306 | |
| 11 | 421 | |
| 12 | 108 | |
| 13 | 84 | |
| 14 | 489 | |
| 15 | 2200 | |
| 16 | 550 | |
| 17 | 2103 | |
| 18 | 2894 | |
| 19 | 244 | |
| 20 | 195 | |
| 21 | 3364 | |
| 22 | 28667 | |
| 23 | 3757 | |
| 24 | 27703 | |
| 25 | 33663 | |
| 26 | 1670 | |
| 27 | 835 | |
| 28 | 34096 | |
| 31 | 207 (28d: 122) | 6.5 |
| 32 | 186 (28d: 106) | 6.5 |
| C1 | 384 | 5.5 |
| C2 | 96 | 4.6 |

| Example | Residual solvent content [mg/m$^2$] | |
|---|---|---|
| 29 | 76 | 5.9 |
| C3 | 69 | 6.0 |

The results show that drying of the adhesive is achieved in the case of the adhesive tapes of the invention. In comparison to adhesive tapes of the prior art (C1-C3), the adhesive tapes of the invention (Examples 1, 2, 29, 5, 6) achieve similar drying efficiency, but without having the disadvantages of the comparative examples in terms of bonding properties. Accordingly, the comparative specimens C1 and C2 produced in accordance with the prior art have lower bond strengths owing to the getter materials dispersed in the adhesive.

These conclusions also apply equivalently with regard to the removal of residual solvents (Example 29 and Comparative Example C3).

When Examples 5 and 6 are compared with Examples 31 and 32, the advantage of a particulate getter material only partly surrounded by matrix material (Examples 5 and 6) relative to a substantially completely surrounded particulate getter material (Examples 31 and 32) becomes apparent: after a storage time of 14 days, Examples 5 and 6 exhibit a much lower water content than Examples 31 and 32. The latter were subsequently stored for a further 14 days, after which their water content was at a similarly low level to that of Examples 5 and 6. The drying was therefore quicker in the case of constructions according to the invention, with particulate getter material only partly surrounded by matrix material.

It is advantageous, furthermore, if the carrier material itself exhibits a high barrier with respect to the permeate (Examples 7, 14, 21 and 28) since in that case the getter capacity can be adapted to the amount of permeate to be actually taken up. In the experiments, the water content found was higher overall than in the complementary examples without a carrier film (3, 10, 17 and 24), permitting the conclusion that only the layer of adhesive in contact with the getter layer was freed from permeate. It would also be possible, therefore, to reduce the getter content in the design of such adhesive tapes.

The invention claimed is:

1. An adhesive tape comprising the layers A, B and C in the order stated, wherein:
    layer A is a first outer layer of adhesive,
    layer B is a continuous layer comprising at least 95 wt %, based on a total weight of the layer B, of at least one inorganic getter material, and
    layer C is a second outer layer of adhesive
    wherein the getter material in its application form has a minimum permeate uptake capacity for water and/or oxygen of 1% of its own weight, and
    wherein the inorganic getter material is selected form the group consisting of calcium sulfate, calcium chloride, calcium oxide, fumed silicas, zeolites, and a mixture of two or more of the above substances.

2. The adhesive tape of claim 1, wherein at least one of the layers A and C consists of a pressure sensitive adhesive.

3. The adhesive tape of claim 2, wherein the getter material is present in particulate form in the layer B.

4. The adhesive tape of claim 1, wherein the getter material is present in particulate form in the layer B.

5. The adhesive tape of claim 1 which comprises, in addition to the layers A, B, and C, a carrier layer which does not comprise any getter material and is disposed between the layers A and C.

6. The adhesive tape of claim 1, wherein layer B comprises at least 99 wt %, based on a total weight of the layer B, of the at least one inorganic getter material.

7. The adhesive tape of claim 1,
    wherein layer A and layer C both consist of pressure sensitive adhesives.

8. An adhesive tape comprising the layers A, B and C in the order stated, wherein:
    layer A is a first outer layer of adhesive,
    layer B is a continuous layer comprising at least 95 wt %, based on a total weight of the layer B, of at least one inorganic getter material, and
    layer C is a second outer layer of adhesive
    wherein layer A and layer C layers each consist of the same adhesive.

9. An adhesive tape comprising the layers A, B and C in the order stated, wherein:
    layer A is a first outer layer of adhesive,
    layer B is a continuous layer comprising at least 95 wt %, based on a total weight of the layer B, of at least one inorganic getter material, and
    layer C is a second outer layer of adhesive, and
    wherein the layer A and the layer C each have a water vapor permeation rate of less than 50 $g/(m^2*d)$, said water vapor permeation rates being measured based on an adhesive thickness of 50 µm, measured at 38° C. and 90% relative humidity in accordance with the American Society for Testing and Materials (ASTM) F-12249 test.

10. An adhesive tape comprising the layers A, B and C in the order stated, wherein:
    layer A is a first outer layer of adhesive,
    layer B is a continuous layer comprising at least 95 wt %, based on a total weight of the layer B, of at least one inorganic getter material, and
    layer C is a second outer layer of adhesive, and
    wherein the adhesive tape further comprises, in addition to the layers A, B, and C, at least one carrier layer and at least one barrier layer against one or more permeates, the barrier layer and the carrier layer being in direct contact with one another and disposed between the layers A and C.

* * * * *